(12) United States Patent
Peng et al.

(10) Patent No.: US 7,172,731 B2
(45) Date of Patent: Feb. 6, 2007

(54) APPARATUS FOR RELEASING PRESSURE IN A VACUUM EXHAUST SYSTEM OF SEMICONDUCTOR EQUIPMENT

(75) Inventors: Chen-Tai Peng, Hsin-Chu Hsien (TW); Leo Lin, Hsin-Chu Hsien (TW); Eric T. Chuang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 759 days.

(21) Appl. No.: 10/318,185

(22) Filed: Dec. 13, 2002

(65) Prior Publication Data

US 2004/0115103 A1   Jun. 17, 2004

(51) Int. Cl.
  *B32B 5/02* (2006.01)
(52) U.S. Cl. ............. 422/117; 422/168; 422/176; 431/5; 137/67; 137/68; 438/680
(58) Field of Classification Search ............ 422/117, 422/168, 176; 431/5; 137/67, 68; 118/900, 118/716–720
See application file for complete search history.

(56) References Cited

U.S. PATENT DOCUMENTS

| | | | | |
|---|---|---|---|---|
| 1,681,698 A | * | 8/1928 | Brooks | 48/192 |
| 5,518,032 A | * | 5/1996 | Berke | 137/899.4 |
| 5,832,843 A | * | 11/1998 | Park et al. | 110/214 |
| 6,322,756 B1 | * | 11/2001 | Arno et al. | 422/171 |
| 6,378,544 B1 | * | 4/2002 | DiBello | 137/68.25 |
| 6,409,779 B2 | * | 6/2002 | Leinemann | 48/192 |
| 6,716,750 B2 | * | 4/2004 | Wu et al. | 438/680 |

FOREIGN PATENT DOCUMENTS

DE      195 29 327    *  8/1995

* cited by examiner

*Primary Examiner*—Glenn Caldarola
*Assistant Examiner*—Alexis Wachtel
(74) *Attorney, Agent, or Firm*—Nath & Associates PLLC; Harold L. Novick

(57) ABSTRACT

An apparatus for protecting a vacuum system of semiconductor equipment is disclosed. The apparatus comprises a process tool and a gas-exploding unit. The process tool includes a gas reaction chamber, and the process tool is connected with a first gas piping to exhaust a waste gas in the gas reaction chamber. The gas-exploding unit includes a gas-exploding chamber, a gas valve, a pressure sensor, and a gas-exploding device for sealing an opening in a wall of the gas-exploding chamber. The gas-exploding chamber is connected with the first gas piping to receive the waste gas. The waste gas in the gas-exploding chamber is transported to a local scrubber through a second gas piping, and then exhausted to a central scrubber. The pressure sensor is used to detect a pressure in the gas-exploding chamber. While the pressure in the gas-exploding chamber detected by the pressure sensor is larger than a reference value, the process tool is shutdown, and the gas valve is then opened to release the waste gas to the central scrubber through a third gas piping.

15 Claims, 2 Drawing Sheets

APPARATUS FOR RELEASING PRESSURE IN A VACUUM EXHAUST SYSTEM OF SEMICONDUCTOR EQUIPMENT

BACKGROUND OF THE INVENTION

1. Field of the Invention

The present invention relates to an apparatus used to protect semiconductor equipment, and, more particularly, to an apparatus for releasing pressure in a vacuum exhaust system of semiconductor equipment.

2. Description of the Prior Art

In the semiconductor factory, combustible gases, such as $H_2$, $SiH_2$, are frequently used in the semiconductor fabrication process. According to practical experience, only a little of the combustible gases are reacted in a process chamber of a semiconductor equipment, and most of the combustible gases are regarded as a waste gas and are exhausted to a local scrubber though an exhaust system. The waste gas will be burned and decomposed by high temperature in the local scrubber, and then exhausted to a central scrubber through a pipe. The waste gas is burned and decomposed by high temperature and a fire source; if an oxygen gas is leaked in the process chamber of the semiconductor equipment or the exhaust system, the fire source in the local scrubber will fire back to the process chamber, and the combustible gases may be exploded. Therefore, the exhaust system, especially a vacuum exhaust system, and the equipment, may be damaged. In addition, workers' security may also be threatened.

According to the description above, an apparatus that can be used to release pressure in the vacuum exhaust system of the semiconductor equipment is needed.

SUMMARY OF THE INVENTION

In accordance with the present invention, an apparatus for releasing pressure in a vacuum exhaust system of a semiconductor equipment is provided to protect the semiconductor equipment from damage.

The apparatus provided to protect the semiconductor equipment mainly comprises a process tool, and a gas-exploding unit.

The process tool includes a gas reaction chamber, and the process tool is connected with a first gas piping to exhaust a waste gas in the gas reaction chamber. The gas-exploding unit includes a gas-exploding chamber, a gas valve, a pressure sensor, and a gas-exploding device for sealing an opening in a wall of the gas-exploding chamber, wherein the gas-exploding chamber is connected with the first gas piping to receive the waste gas from the gas reaction chamber. The waste gas in the gas-exploding chamber is transported to a local scrubber through a second gas piping, and then exhausted to a central scrubber. The pressure sensor is used to detect a pressure in the gas-exploding chamber.

While the pressure in the gas-exploding chamber detected by the pressure sensor is larger than a reference value, the process tool is shutdown by a controller, and the gas-valve is then opened to release the waste gas to the central scrubber through a third gas piping. If the pressure in the gas-exploding chamber is too large to be released through the gas valve, then the gas-exploding device will be broken to release the waste gas in the gas-exploding chamber to atmosphere.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
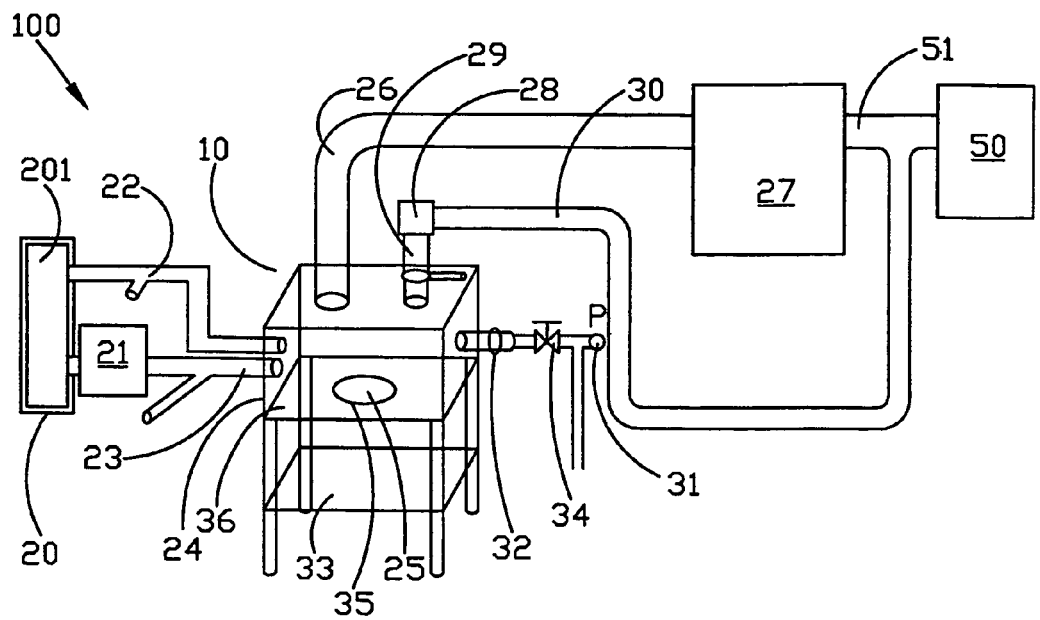
FIG. 1 is a schematic diagram of an apparatus for protecting semiconductor equipment according to an embodiment of the present invention.

In one preferred embodiment, such as illustrated in FIG. 1, an apparatus 100 for protecting semiconductor equipment according to the present invention mainly comprises a gas-exploding unit 10 and a process tool 20. The process tool 20, such as a CVD□(Chemistry Vapor Deposition)□equipment, includes a gas reaction chamber 201. A local scrubber 27, a central scrubber 50, and some connecting pipe can be defined as a peripheral equipment for this protecting apparatus. The details will be described hereinafter.

The gas-exploding unit 10 includes a gas-exploding chamber 24, a pressure sensor 31, a gas valve 28, and a gas-exploding device 25 for sealing an opening 35 in a wall 36 of the gas-exploding chamber 24. A waste gas in the gas reaction chamber 201 of the process tool 20 is transported to the gas-exploding chamber 24 through a first piping, such as a piping 23 connected with a dry pump 21 or an ATM□ (atmosphere)□piping 22; meanwhile, a diluted nitrogen gas ($N_2$) is injected into the ATM piping 22 and the piping 23 to decrease the concentration of the waste gas. The gas-exploding unit 10 is designed to protect the process tool 20 from damage caused by gas explosion. The gas-exploding chamber 24, for example, is made of a stainless steel. The stainless steel type may be SUS316, and its thickness is 5 mm.

The gas-exploding device 25, such as a gas-exploding disk, is for sealing the opening 35 in the wall 36 of the gas-exploding chamber 24. The gas-exploding disk can be, for example, made of glass. For example, the glass is 6 inch diameter, and 2 mm thickness. Typically, a thin mesh 33 is placed outside the gas-exploding device 25, and the thin mesh 33 opening is 1 mm. The waste gas in the gas-exploding chamber 24 is transported to the local scrubber 27 through a second gas piping 26. The waste gas will be burned and decomposed by high temperature in the local scrubber 27. The burned and decomposed waste gas is then exhausted to the central scrubber 50 through a pipe 51.

The pressure sensor 31 is connected to the gas-exploding chamber 24 via a pipe 32, and is used to detect a pressure in the gas-exploding chamber 24. The gas valve 28 is connected to the gas-exploding chamber 24 via a pipe 29. A diluted nitrogen gas □$N_2$□ can be injected into the pipe 29 in front of the gas valve 28 to prevent the gas valve 28 erosion. The gas valve 28 gauge is 2 inch, and the pipe 29 gauge is 8 inch. The gas-exploding unit 10 can further comprise a manual valve 34 in front of the pressure sensor 31, wherein a test pressure can be provided by the manual valve 34 to test functions of the pressure sensor 31. The test pressure set range is −1~9 kg/cm². Similarly, a diluted nitrogen gas□$N_2$□ can be provided by the pipe 32 to prevent the pressure sensor 31 and the manual valve 34 erosion. As an example, the pipe 32 gauge can be 2 inch.

Figure 2:
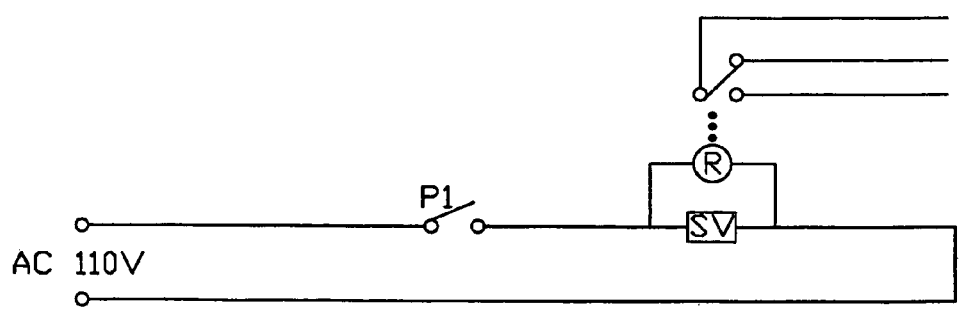
FIG. 2 is a schematic diagram of a controller according to an embodiment of the invention.

When an oxygen gas is leaked in the process chamber or vacuum piping, the waste gas, such as $SiH_4$ or $H_2$, of the vacuum piping will be burned or exploded, and then the pressure in the gas-exploding chamber 24 is to be in an abnormal condition. While the pressure in the gas-exploding chamber 24 detected by the pressure sensor 31 is larger than a reference value P, the gas valve 28 will be opened to release the waste gas in the gas-exploding chamber 24 to the central scrubber 50 through a third gas piping 30, and the process tool 20 will be shutdown by a controller. The controller, for example, is a AC (alternating current) circuit, as illustrated in FIG. 2. When the controller receives an abnormal signal from the pressure sensor 31, the P1 is closed to make a circuit, the gas valve 28 is opened to release the waste gas in the gas-exploding chamber 24 to the central scrubber 50 through the third gas piping 30, and the process tool 20 is shutdown by a relay. If the pressure is too large to be released through the gas valve 28, then the gas-exploding device 25, such as the gas-exploding disk made of glass, can be broken with the excessive pressure to release the waste gas in the gas-exploding chamber 24 to atmosphere, and thus the process tool 20 is protected.

Figure 3:
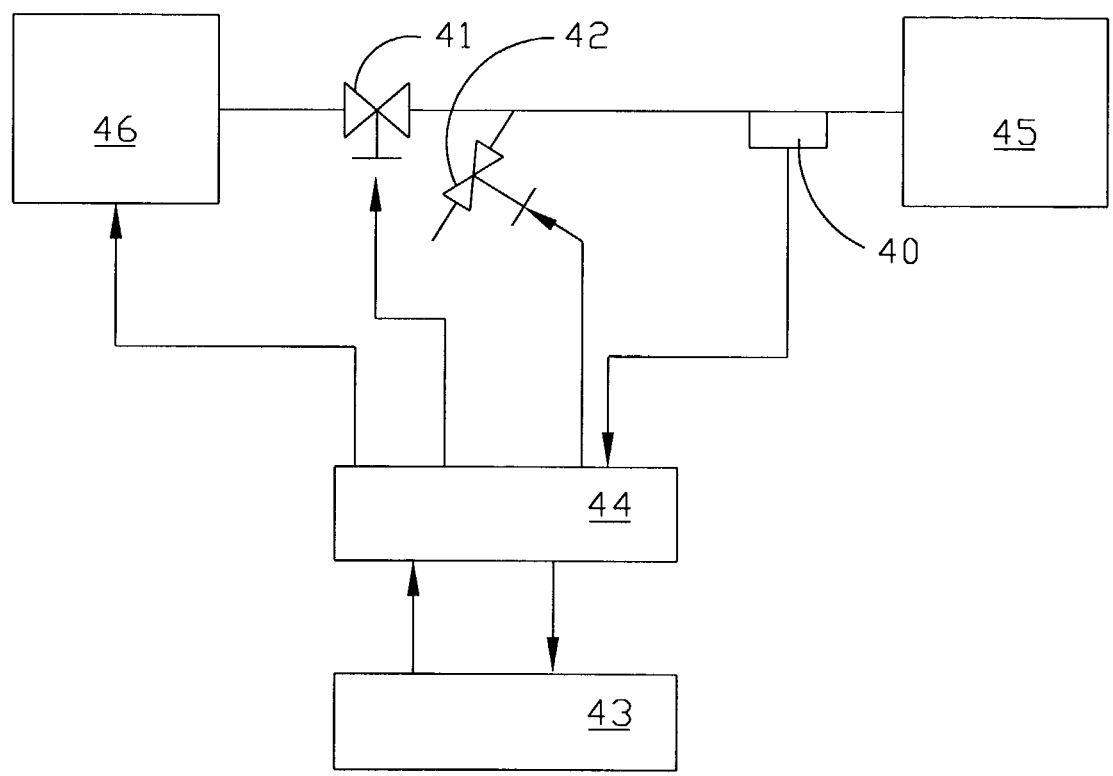
FIG. 3 is a schematic diagram of a fireproof installation according to an embodiment of the invention.

The apparatus according to the present invention further comprises a fireproof installation. As illustrated in FIG. 3, the fireproof installation comprises an IR sensor 40, a first air valve 41, a second air valve 42, a controller 43, and an interface 44. The IR sensor 40 can be used for sensing a fire burning in a piping in front of a local scrubber 45. When an oxygen gas is leaked in a process chamber 46 or a piping, the fire may be burned from the local scrubber 45 to the process tool 46. When the controller 43 receives an abnormal burning signal from the IR sensor 40 through the interface 44, the first air valve 41 is closed to avoid the process chamber 46 being burned, and the second air valve 42 is then opened to purge a great quantity of nitrogen gas□$N_2$□into the piping to reduce combustible gas concentration to go out the fire, and the process tool 46 is shutdown through the interface 44. The interface 44 is PCB.

Although specific embodiments have been illustrated and described, it will be obvious to those skilled in the art that various modifications may be made without departing from what is intended to be limited solely by the appended claims.

What is claimed is:

1. An apparatus for releasing pressure in a vacuum exhaust system of semiconductor equipment, said apparatus comprising:
    a process tool including a gas reaction chamber, said process tool connecting a first gas piping to exhaust a waste gas in said gas reaction chamber; and
    a gas-exploding unit including a gas-exploding chamber, a pressure sensor, a gas valve, and a gas-exploding device for sealing an opening in a wall of said gas-exploding chamber, wherein said gas-exploding chamber is connected with said first gas piping to receive said waste gas from said gas reaction chamber, said waste gas in said gas-exploding chamber is transported to a local scrubber through a second gas piping and then exhausted to a central scrubber, said pressure sensor is used to detect a pressure in said gas-exploding chamber, such that while said pressure in said gas-exploding chamber detected by said pressure sensor is larger than a reference value, said process tool is shutdown, and said gas valve is then opened to release said waste gas to said central scrubber through a third gas piping.

2. The apparatus according to claim 1, wherein said process tool includes a CVD (Chemical Vapor Deposition) equipment.

3. The apparatus according to claim 1, wherein said gas-exploding chamber is made of stainless steel.

4. The apparatus according to claim 1, wherein the gas-exploding unit further comprises a thin mesh located outside said gas-exploding device.

5. The apparatus according to claim 1, wherein said gas-exploding device is a gas-exploding disk made of glass.

6. The apparatus according to claim 1, wherein said gas-exploding unit further comprises a manual valve in front of said pressure sensor, and said manual valve provides a test pressure to test functions of said pressure sensor.

7. The apparatus according to claim 6, wherein said gas-exploding unit further comprising a first pipe providing a diluted nitrogen gas ($N_2$) to prevent said pressure sensor and erosion of said manual valve.

8. The apparatus according to claim 1, further comprising a fireproof installation to prevent a fire burning back to said gas reaction chamber from said local scrubber.

9. The apparatus according to claim 8, said fireproof installation comprising:
    a IR sensor used for sensing said fire burning in a piping in front of a said local scrubber;
    a controller; and
    a first air valve and a second air valve;
    when said controller receives an abnormal burning signal from said IR sensor through a interface, said process tool is shutdown by said controller through said interface, said first valve is closed to avoid said process chamber being burned, and said second valve is then opened to purge a great quantity of nitrogen gas ($N_2$) into said piping to put out said fire.

10. The apparatus according to claim 9, wherein said interface is PCB.

11. The apparatus according to claim 1, wherein said gas-exploding device will be broken to release said waste gas in said gas-exploding chamber to atmosphere, while said pressure in said gas-exploding chamber is too large to be released.

12. The apparatus according to claim 1, wherein said first gas piping is connected to a dry pump.

13. The apparatus according to claim 1, wherein said first gas piping is an ATM (atmosphere) piping.

14. The apparatus according to claim 1, further comprising a second pipe providing a diluted nitrogen gas ($N_2$) injecting into said first gas piping to decrease concentration of said waste gas.

15. The apparatus according to claim 1, wherein said waste gas is burned and decomposed in said local scrubber.

* * * * *